United States Patent
Mogi et al.

(10) Patent No.: US 11,211,422 B2
(45) Date of Patent: Dec. 28, 2021

(54) SOLID-STATE IMAGE SENSOR AND ELECTRONIC APPARATUS

(71) Applicant: SONY CORPORATION, Tokyo (JP)

(72) Inventors: Hideaki Mogi, Kanagawa (JP); Yohei Hirose, Tokyo (JP); Shintarou Hirata, Tokyo (JP); Yuya Kumagai, Kanagawa (JP); Tetsuji Yamaguchi, Kanagawa (JP); Masaki Murata, Tokyo (JP); Yasuharu Ujiie, Tokyo (JP)

(73) Assignee: SONY CORPORATION, Tokyo (JP)

( * ) Notice: Subject to any disclaimer, the term of this patent is extended or adjusted under 35 U.S.C. 154(b) by 431 days.

(21) Appl. No.: 16/086,248

(22) PCT Filed: Mar. 14, 2017

(86) PCT No.: PCT/JP2017/010103
§ 371 (c)(1),
(2) Date: Sep. 18, 2018

(87) PCT Pub. No.: WO2017/169719
PCT Pub. Date: Oct. 5, 2017

(65) Prior Publication Data
US 2020/0295074 A1    Sep. 17, 2020

(30) Foreign Application Priority Data
Mar. 28, 2016 (JP) .............................. JP2016-064074

(51) Int. Cl.
*H01L 27/146* (2006.01)
*H04N 5/369* (2011.01)

(52) U.S. Cl.
CPC ....... *H01L 27/14645* (2013.01); *H04N 5/379* (2018.08)

(58) Field of Classification Search
None
See application file for complete search history.

(56) References Cited

U.S. PATENT DOCUMENTS

| | | | |
|---|---|---|---|
| 2009/0090903 A1* | 4/2009 | Kim | H01L 27/307 257/40 |
| 2009/0188547 A1* | 7/2009 | Hayashi | B82Y 10/00 136/249 |
| 2017/0092876 A1 | 3/2017 | Murata et al. | |

FOREIGN PATENT DOCUMENTS

| | | |
|---|---|---|
| CN | 106575708 A | 4/2017 |
| JP | 2007-287930 A | 11/2007 |

(Continued)

OTHER PUBLICATIONS

PubChem Compound database, CID 54693397, https://pubchem.ncbi.nlm.nih.gov/compound/54693397, created on Dec. 26, 2011. (Year: 2011).*

(Continued)

*Primary Examiner* — Anthony Ho
*Assistant Examiner* — Kevin Quinto
(74) *Attorney, Agent, or Firm* — Chip Law Group

(57) ABSTRACT

Provided is a solid-state image sensor of a vertical spectral diffraction type in which a plurality of photoelectric conversion units are stacked in a region of each pixel, the solid-state image sensor includes a first photoelectric conversion module that includes a first photoelectric conversion unit that to performs photoelectric conversion on light in a first wavelength range of incident light, a first upper electrode and a first lower electrode with the first photoelectric conversion unit between the first upper electrode and the first lower electrode, and a first spectral correction unit between the first upper electrode and the first lower electrode stacked on the first photoelectric conversion unit and a second photoelectric conversion unit that performs photoelectric conversion on light in a second wavelength range of light that has passed through the first photoelectric (Continued)

conversion module, the second wavelength range is different from the first wavelength range.

7 Claims, 12 Drawing Sheets

(56) References Cited

FOREIGN PATENT DOCUMENTS

| TW | 201622197 A | 6/2016 |
|---|---|---|
| WO | 2015/178116 A1 | 11/2015 |
| WO | 2016/027675 A1 | 2/2016 |

OTHER PUBLICATIONS

PubChem Compound database, CID 65149, https://pubchem.ncbi.nlm.nih.gov/compound/65149, created on Mar. 26, 2005. (Year: 2005).*

International Search Report and Written Opinion of PCT Application No. PCT/JP2017/010103, dated Jun. 6, 2017, 09 pages of ISRWO.

* cited by examiner

SOLID-STATE IMAGE SENSOR AND ELECTRONIC APPARATUS

CROSS REFERENCE TO RELATED APPLICATIONS

This application is a U.S. National Phase of International Patent Application No. PCT/JP2017/010103 filed on Mar. 14, 2017, which claims priority benefit of Japanese Patent Application No. JP 2016-064074 filed in the Japan Patent Office on Mar. 28, 2016. Each of the above-referenced applications is hereby incorporated herein by reference in its entirety.

TECHNICAL FIELD

The present disclosure relates to a solid-state image sensor and an electronic apparatus, and particularly relates to a solid-state image sensor of a vertical spectral diffraction type that can generate color signals of red (R), green (G), and blue (B) from a region of one pixel, and an electronic apparatus.

BACKGROUND ART

There has been proposed a solid-state image sensor of a vertical spectral diffraction type that can generate a plurality of color signals from a region of one pixel, which is obtained by stacking a plurality of photoelectric conversion units (e.g., organic photoelectric conversion films and photodiodes (PDs)) in the depth direction of a substrate, for example.

A solid-state image sensor of a vertical spectral diffraction type has the following advantages: false color is unlikely to occur because demosaic processing is not needed, and usage efficiency of light is higher than that of a conventional individual image sensor that generates a color signal of one of R, G, and B from a region of one pixel.

In a vertical spectral diffraction type, however, the influence in color separation characteristics on a lower layer needs to be taken into consideration. Specifically, light that cannot be absorbed by a photoelectric conversion unit on the upper layer side may proceed to a photoelectric conversion unit on the lower layer side to serve as a color mixing component and be converted to charge. To prevent this, forming a color separation correction layer that limits passage of light in a specific wavelength range between layers of the photoelectric conversion units has been proposed (e.g., see Patent Literature 1).

FIG. 1 illustrates an example of a configuration of an individual image sensor of a vertical spectral diffraction type that includes an existing color separation correction layer.

This solid-state image sensor 10 includes an on-chip lens 11, an upper transparent electrode 12, a photoelectric conversion film (G) 13 that performs photoelectric conversion on light in a G wavelength range, a lower transparent electrode 14, an interlayer insulating layer 15, a photoelectric conversion layer (B) 18 that performs photoelectric conversion on light in a B wavelength range, and a photoelectric conversion layer (R) 19 that performs photoelectric conversion on light in a R wavelength range, which are stacked in sequence from the light incident surface side.

In the interlayer insulating layer 15 are formed a spectral correction color filter 16 corresponding to the color separation correction layer, and a through electrode 17 configured to transfer charge obtained by conversion by the photoelectric conversion film (G) 13 to a wiring layer (not illustrated).

In the solid-state image sensor 10, a G component of incident light collected by the on-chip lens 11 is photoelectrically converted by the photoelectric conversion film (G) 13, and a wavelength of light that has passed through the photoelectric conversion film (G) 13 is limited by the spectral correction color filter 16. Furthermore, a B component and an R component of light that has passed through the spectral correction color filter 16 are photoelectrically converted respectively by the photoelectric conversion layer (B) 18 and the photoelectric conversion layer (R) 19.

CITATION LIST

Patent Literature

Patent Literature 1: JP 2007-287930A

DISCLOSURE OF INVENTION

Technical Problem

However, in the case of forming the spectral correction color filter 16 as the color separation correction layer, its pigment concentration is generally approximately 50% at most and thus the spectral correction color filter 16 is difficult to make thinner; accordingly, the film thickness of the interlayer insulating film 15 also becomes large. Moreover, it is necessary to planarize the interlayer insulating film 15 by chemical mechanical planarization (CMP) after the formation of the spectral correction color filter 16, which also requires thickness of the interlayer insulating film 15.

In the case where the thickness of the interlayer insulating film 15 is maintained in view of the above circumstances, an optical path from the light incident surface to the photoelectric conversion layer (B) 18 and the photoelectric conversion layer (R) 19 on the lower layer side becomes long, which may lead to a decrease in light collection efficiency and degradation in oblique light resistance. In addition, a reduction in the height of the solid-state image sensor 10 is inhibited.

Furthermore, the spectral correction color filter 16 present on the lower layer side causes constraints on a formation step of the lower transparent electrode 14.

The present disclosure has been made in view of such circumstances, and aims to make an interlayer insulating film thinner to suppress a decrease in light collection efficiency and degradation in oblique light resistance and enable a reduction in the height of a solid-state image sensor.

Solution to Problem

A solid-state image sensor according to a first aspect of the present disclosure is a solid-state image sensor of a vertical spectral diffraction type in which a plurality of photoelectric conversion units are stacked in a region of each pixel, the solid-state image sensor including: a first photoelectric conversion module that includes a first photoelectric conversion unit configured to perform photoelectric conversion on light in a first wavelength range of incident light, a first upper electrode and a first lower electrode formed with the first photoelectric conversion unit placed between the first upper electrode and the first lower electrode, and a first spectral correction unit formed between the first upper electrode and the first lower electrode to be stacked on the first photoelectric conversion unit; and a second photoelectric conversion unit configured to perform photoelectric conversion on light in a second wavelength range of light that has passed through the first photoelectric conversion module, the second wavelength range being different from the first wavelength range.

The solid-state image sensor according to the first aspect of the present disclosure can further include a third photoelectric conversion unit configured to perform photoelectric conversion on light in a third wavelength range of light that has passed through the first photoelectric conversion module and the second photoelectric conversion unit, the third wavelength range being different from the first and second wavelength ranges.

The first spectral correction unit can have at least one of a function of extracting a carrier from the first photoelectric conversion unit and a function of blocking electron injection to the first photoelectric conversion unit.

The first spectral correction unit can be made of a quantum dot material, a low-molecular organic material, or a high-molecular organic material having a light absorption peak in a specific wavelength range.

In the first photoelectric conversion module, the first upper electrode, the first photoelectric conversion unit, the first spectral correction unit, and the first lower electrode can be stacked in sequence from a light incident side.

The first photoelectric conversion module can further include a hole blocking unit, and the first upper electrode, the hole blocking unit, the first photoelectric conversion unit, the first spectral correction unit, and the first lower electrode can be stacked in sequence from a light incident side.

The first photoelectric conversion module can further include a second spectral correction unit, and the first upper electrode, the second spectral correction unit, the first photoelectric conversion unit, the first spectral correction unit, and the first lower electrode can be stacked in sequence from a light incident side.

The solid-state image sensor according to the first aspect of the present disclosure can further include a second photoelectric conversion module that includes a third photoelectric conversion unit configured to perform photoelectric conversion on light in a third wavelength range of light that has passed through the first photoelectric conversion module, the third wavelength range being different from the first wavelength range, a second upper electrode and a second lower electrode formed with the third photoelectric conversion unit placed between the second upper electrode and the second lower electrode, and a third spectral correction unit formed between the second upper electrode and the second lower electrode to be stacked on the third photoelectric conversion unit. The second photoelectric conversion unit can perform photoelectric conversion on light in the second wavelength range of light that has passed through the first and second photoelectric conversion modules.

An electronic apparatus according to a second aspect of the present disclosure is an electronic apparatus equipped with a solid-state image sensor of a vertical spectral diffraction type in which a plurality of photoelectric conversion units are stacked in a region of each pixel. The solid-state image sensor includes a first photoelectric conversion module that includes a first photoelectric conversion unit configured to perform photoelectric conversion on light in a first wavelength range of incident light, a first upper electrode and a first lower electrode formed with the first photoelectric conversion unit placed between the first upper electrode and the first lower electrode, and a first spectral correction unit formed between the first upper electrode and the first lower electrode to be stacked on the first photoelectric conversion unit, and a second photoelectric conversion unit configured to perform photoelectric conversion on light in a second wavelength range of light that has passed through the first photoelectric conversion module, the second wavelength range being different from the first wavelength range.

Advantageous Effects of Invention

According to the first and second aspects of the present disclosure, a decrease in light collection efficiency and degradation in oblique light resistance can be suppressed, and a solid-state image sensor can be reduced in height.

MODE(S) FOR CARRYING OUT THE INVENTION

Hereinafter, best modes (hereinafter called embodiments) for carrying out the present disclosure will be described in detail with reference to the drawings.

First Embodiment

Figure 2:
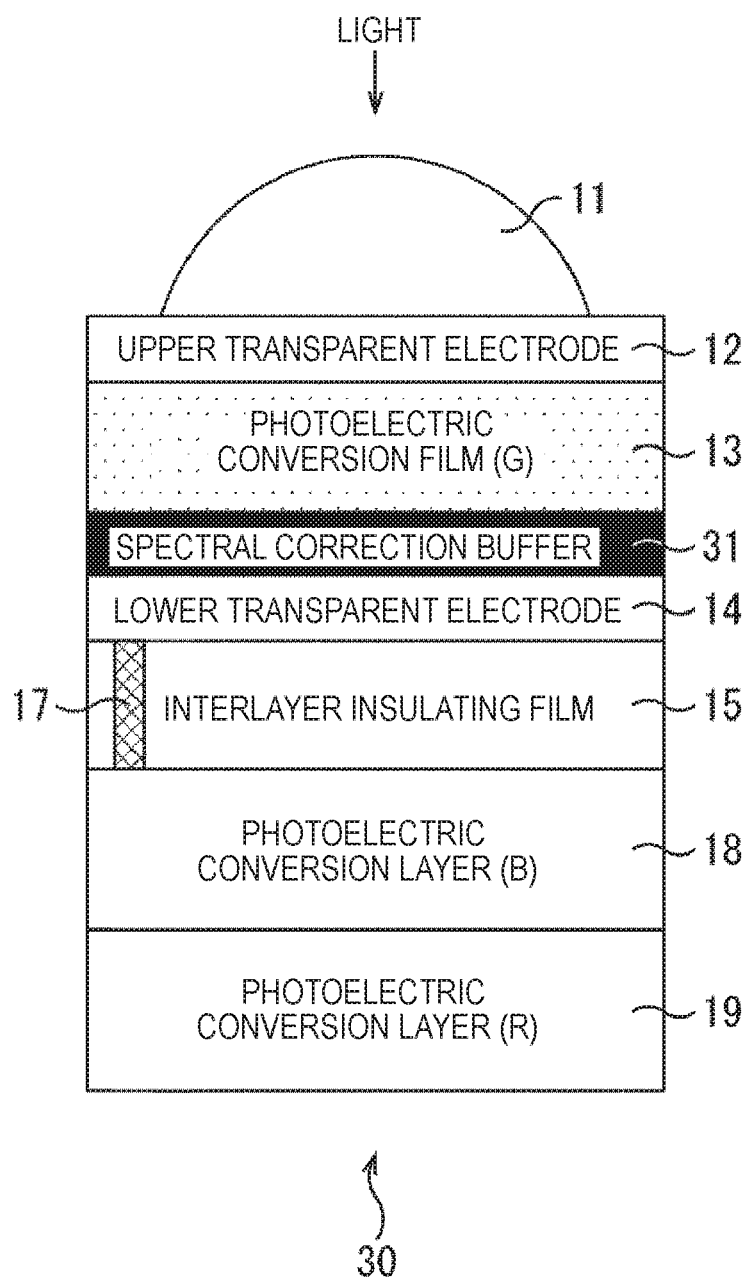
FIG. 2 is a cross-sectional view illustrating a first configuration example of a solid-state image sensor to which the present disclosure is applied.

FIG. 2 is a cross-sectional view illustrating a first configuration example (first embodiment) of a solid-state image sensor to which the present disclosure is applied. Note that components shared by a solid-state image sensor 30, which is the first embodiment, and the solid-state image sensor 10 described above are denoted by the same reference numerals, and description thereof is omitted as appropriate.

This solid-state image sensor 30 includes the on-chip lens 11, the upper transparent electrode 12, the photoelectric conversion film (G) 13, a spectral correction buffer 31, the lower transparent electrode 14, the interlayer insulating layer 15, the photoelectric conversion layer (B) 18, and the photoelectric conversion layer (R) 19, which are stacked in sequence from the light incident surface side.

In the interlayer insulating layer 15 is formed the through electrode 17 configured to transfer charge obtained by conversion by the photoelectric conversion film (G) 13 to a wiring layer (not illustrated).

Figure 1:
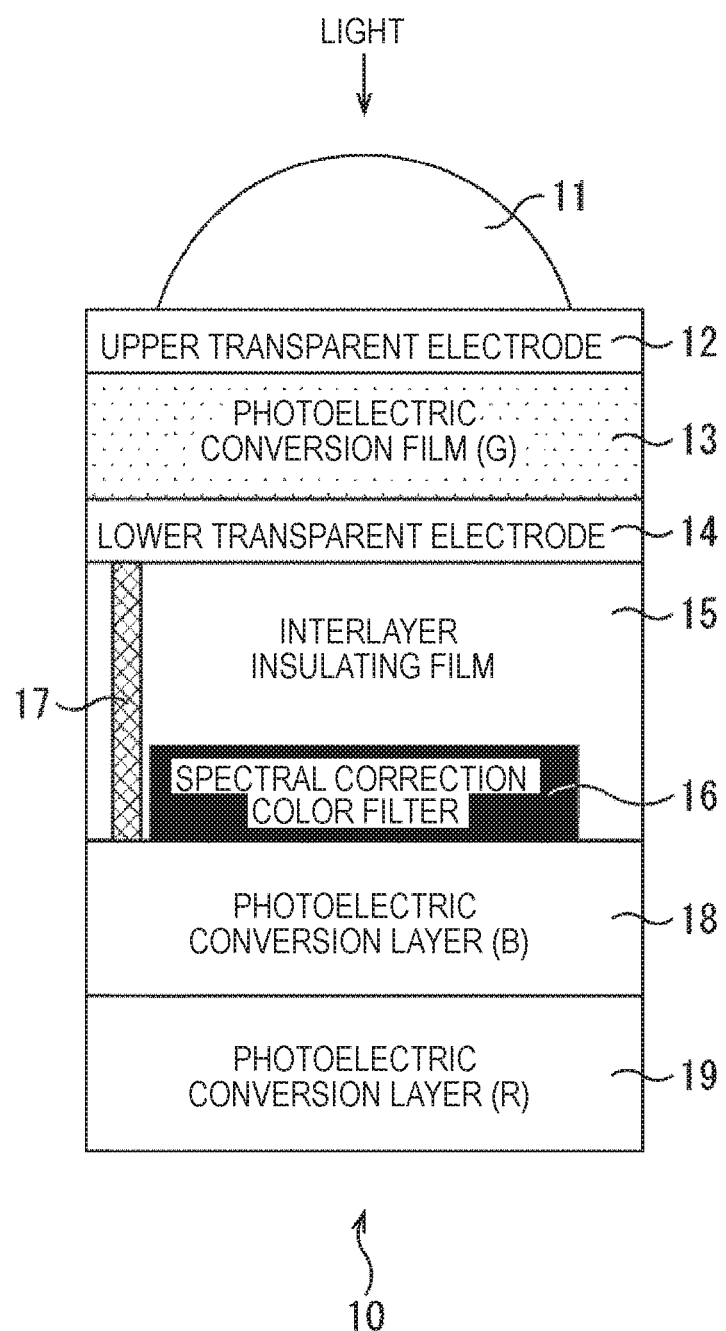
FIG. 1 is a cross-sectional view illustrating an example of a configuration of a solid-state image sensor of a vertical spectral diffraction type that includes an existing color separation correction layer.

That is, the solid-state image sensor 30 is obtained by deleting the spectral correction color filter 16 from the interlayer insulating film 15 of the solid-state image sensor 10 illustrated in FIG. 1 and, instead, forming the spectral correction buffer 31 between the photoelectric conversion film (G) 13 and the lower transparent electrode 14.

In the solid-state image sensor 30, a photoelectric conversion module is constituted by the upper transparent electrode 12, the photoelectric conversion film (G) 13, the spectral correction buffer 31, and the lower transparent electrode 14.

A material for the upper transparent electrode 12 and the lower transparent electrode 14 preferably has a bandgap of at least 2.5 eV or more, preferably 3.1 eV or more, and is preferably transparent with respect to light of a wavelength in a visible range 400 to 700 nm. Specifically examples include ITO, IZO, IGZO, and GZO.

A material for the spectral correction buffer 31 is preferably a material having a light absorption peak in a specific wavelength range. Examples include a quantum dot material, a low-molecular organic material, and a high-molecular organic material. Specifically, quantum dot materials include ZnSe and CdSe. Low-molecular organic materials and high-molecular organic materials include a carbazole derivative, an amine derivative, a naphthalene diimide derivative, a phthalocyanine derivative, a thiophene derivative, a quinacridone derivative, and a fullerene derivative.

In the case where the spectral correction buffer 31 is formed by evaporatively depositing the above material with a concentration of 100%, its thickness can be smaller than that of the spectral correction color filter 16 of FIG. 1.

The spectral correction buffer 31 performs spectral correction by absorbing a wavelength range different from a wavelength range in which the photoelectric conversion film (G) 13 performs photoelectric conversion; hence, it is preferable that photoelectric conversion not be performed in the spectral correction buffer 31.

Figure 3:
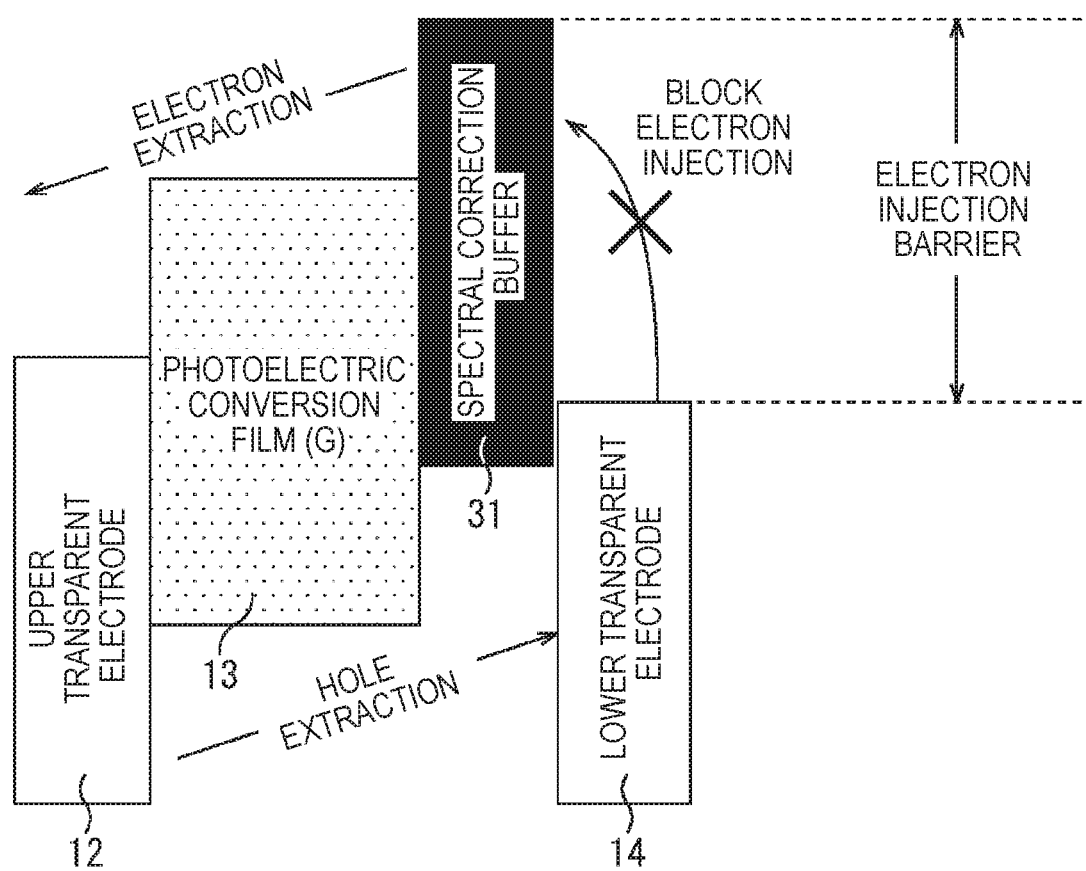
FIG. 3 is an energy diagram of a spectral correction buffer.

Next, FIG. 3 is an energy diagram illustrating requirements of carrier behavior in the spectral correction buffer 31.

As illustrated in the drawing, the spectral correction buffer 31 has, in addition to a spectral correction function of limiting passage of light in a specific wavelength range, a function of extracting carriers from the photoelectric conversion film (G) 13 and an electron injection blocking function of preventing injection of electrons from the lower transparent electrode 14 to the photoelectric conversion film (G) 13.

An electron injection barrier, which is an energy difference between a lowest unoccupied molecular orbital (LUMO) level of the spectral correction buffer 31 and the lower transparent electrode 14, to enable the electron injection blocking function is at least 1.0 eV or more, 1.5 eV or more if possible, preferably 2.0 eV or more; thus, dark current can be suppressed sufficiently.

In the case where the lower transparent electrode 14 is made of ITO, its work function is approximately 5 eV; hence, the LUMO level of the spectral correction buffer 31 is preferably around 3.0 eV. Furthermore, in consideration of a junction between a highest occupied molecular orbital (HOMO) level and the lower transparent electrode 14, the HOMO level of the spectral correction buffer 31 is required to be equivalent to or lower than the lower transparent electrode 14.

Figure 4A:
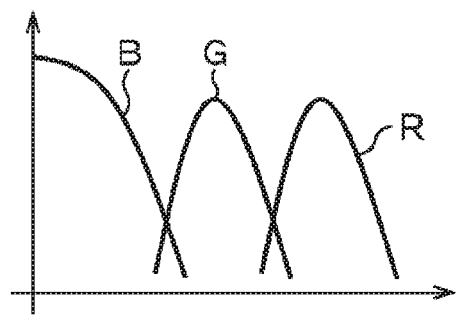
FIGS. 4A, 4B, and 4C illustrate a spectral correction function of a spectral correction buffer.
Figure 4B:
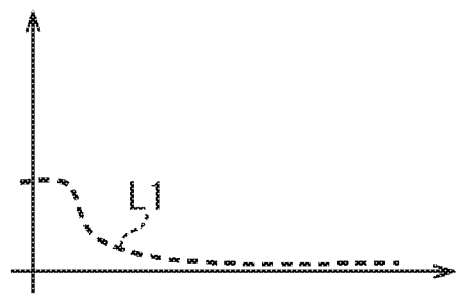
Figure 4C:
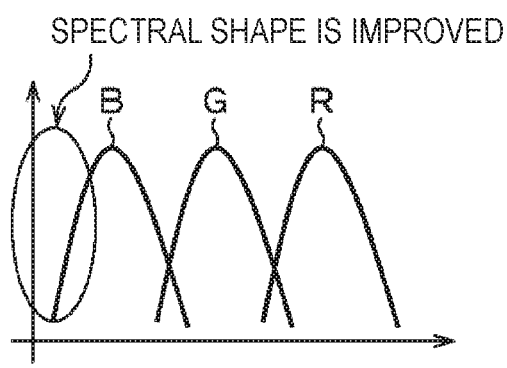

Next, FIGS. 4A, 4B, and 4C illustrate a spectral correction function of the spectral correction buffer 31, and the horizontal axis and the vertical axis represent wavelength and intensity, respectively.

In FIG. 4A, a curve B, a curve G, and a curve R indicate, respectively, a wavelength range of light that enters the photoelectric conversion layer (B) 18, a wavelength range of light that enters the photoelectric conversion film (G) 13, and a wavelength range of light that enters the photoelectric conversion layer (R) 19, in a state where the spectral correction buffer 31 is omitted from the solid-state image sensor 30.

A curve L1 in FIG. 4B indicates a wavelength range that the spectral correction buffer 31 absorbs (limits passage of).

In FIG. 4C, a curve B, a curve G, and a curve R indicate, respectively, a wavelength range of light that enters the photoelectric conversion layer (B) 18, a wavelength range of light that enters the photoelectric conversion film (G) 13, and a wavelength range of light that enters the photoelectric conversion layer (R) 19, in the solid-state image sensor 30.

For example, in the case where a peak of the wavelength range of light that enters the photoelectric conversion layer (B) 18 spreads on the low wavelength side, as indicated by the curve B in FIG. 4A, the spectral correction buffer 31 that absorbs the low wavelength side of the peak of blue light as indicated by the curve L1 in FIG. 4B is used. This improves the spectral shape of light that enters the photoelectric conversion layer (B) 18, as illustrated in FIG. 4C.

According to the solid-state image sensor 30, the spectral correction buffer 31 is formed in the photoelectric conversion module, which eliminates the need to form the spectral correction color filter 16 in the interlayer insulating film 15; thus, the interlayer insulating film 15 can be made thinner. In addition, the photoelectric conversion module including the spectral correction buffer 31 can be formed consistently, which reduces the number of steps as a whole. It is also possible to improve heat resistance of a formation step of the lower transparent electrode 14 and a margin related to patterning etc. Furthermore, a height reduction can be achieved as compared with the solid-state image sensor 10; thus, light collection efficiency and oblique light resistance can be improved.

Second Embodiment

Figure 5:
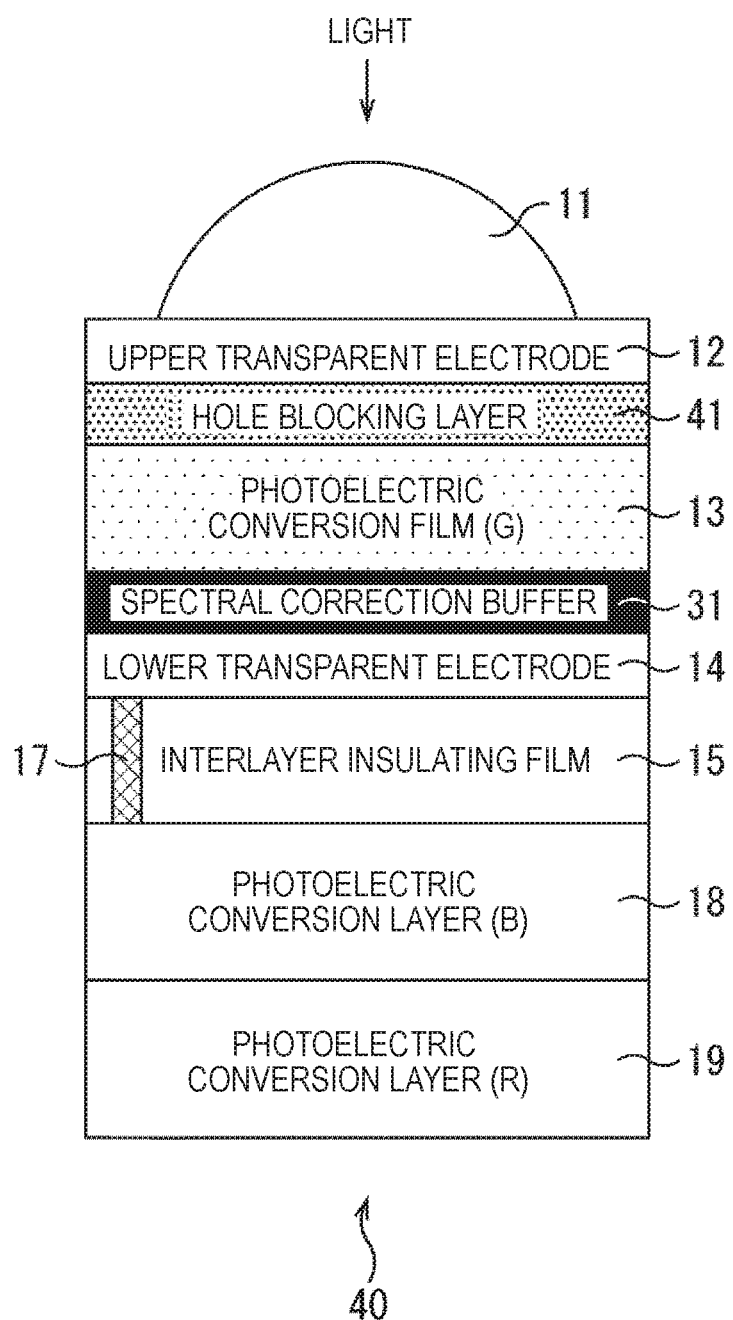
FIG. 5 is a cross-sectional view illustrating a second configuration example of a solid-state image sensor to which the present disclosure is applied.

FIG. 5 is a cross-sectional view illustrating a second configuration example (second embodiment) of a solid-state image sensor to which the present disclosure is applied. Note that components shared by a solid-state image sensor 40, which is the second embodiment, and the solid-state image sensors 10 and 30 described above are denoted by the same reference numerals, and description thereof is omitted as appropriate.

This solid-state image sensor 40 is obtained by adding, to the solid-state image sensor 30 illustrated in FIG. 2, a hole blocking layer 41 between the upper transparent electrode 12 and the photoelectric conversion film (G) 13.

In the solid-state image sensor 40, a photoelectric conversion module is constituted by the upper transparent electrode 12, the hole blocking layer 41, the photoelectric conversion film (G) 13, the spectral correction buffer 31, and the lower transparent electrode 14.

The hole blocking layer 41 is not required to have a spectral correction function; hence, as its material, it is possible to use NiO, ZnO, or the like as an inorganic oxide film semiconductor, as well as the same material as the material of the spectral correction buffer 31. Note that the hole blocking layer 41 may be formed using a single material, or may have a stacked structure including a plurality of materials.

Figure 6:
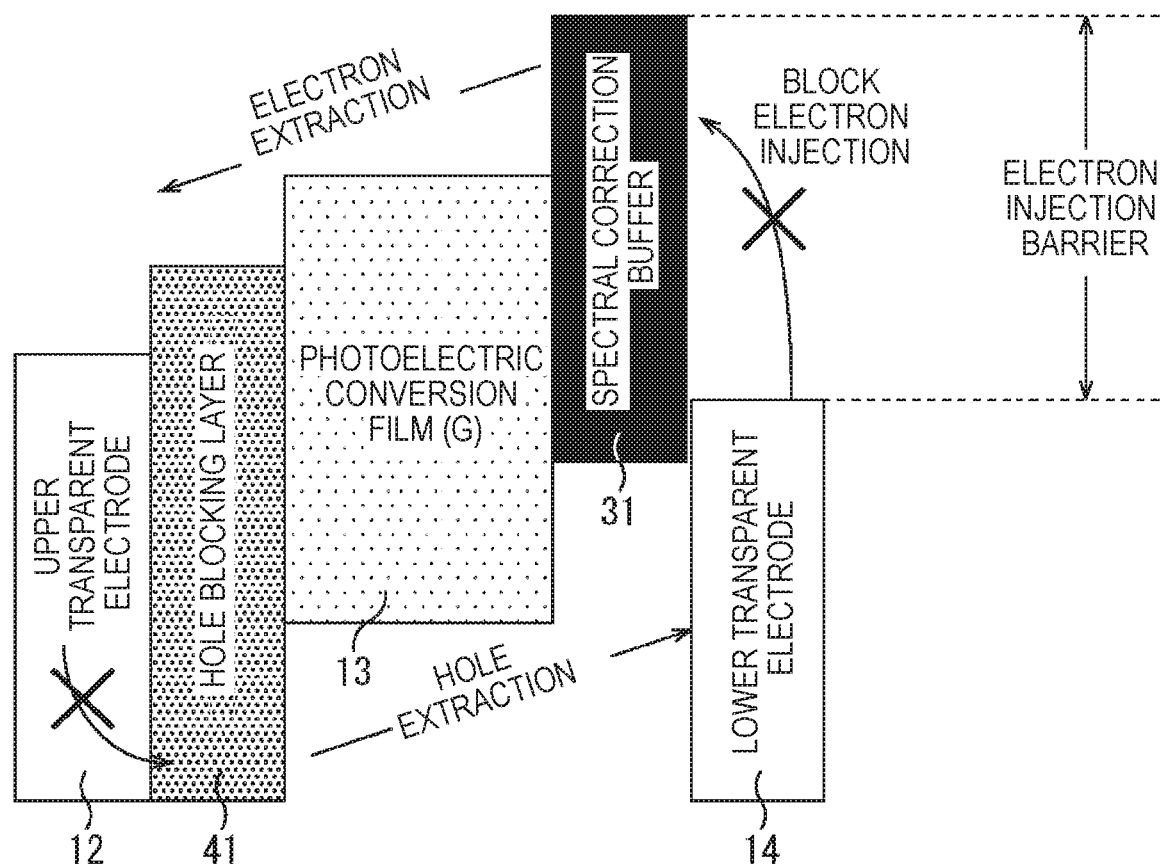
FIG. 6 is an energy diagram of a hole blocking layer and a spectral correction buffer.

Next, FIG. 6 is an energy diagram illustrating requirements of carrier behavior in the hole blocking layer 41 and the spectral correction buffer 31.

As illustrated in the drawing, the hole blocking layer 41 has a dark current suppressing blocking function of preventing injection of holes from the upper transparent electrode 12 to the photoelectric conversion film (G) 13. For the hole blocking layer 41 to function sufficiently, it is preferable that the HOMO level of the hole blocking layer 41 be at least 1.0 eV or more, 1.5 eV or more if possible, preferably 2.0 eV or more from the upper transparent electrode 12.

The spectral correction buffer 31 is similar to that in the case described above with reference to FIG. 3.

According to the solid-state image sensor 40, the spectral correction buffer 31 and the hole blocking layer 41 are formed in the photoelectric conversion module; thus, in addition to effects similar to those of the solid-state image sensor 30, conversion efficiency in the photoelectric conversion film (G) 13 can be further improved.

Third Embodiment

Figure 7:
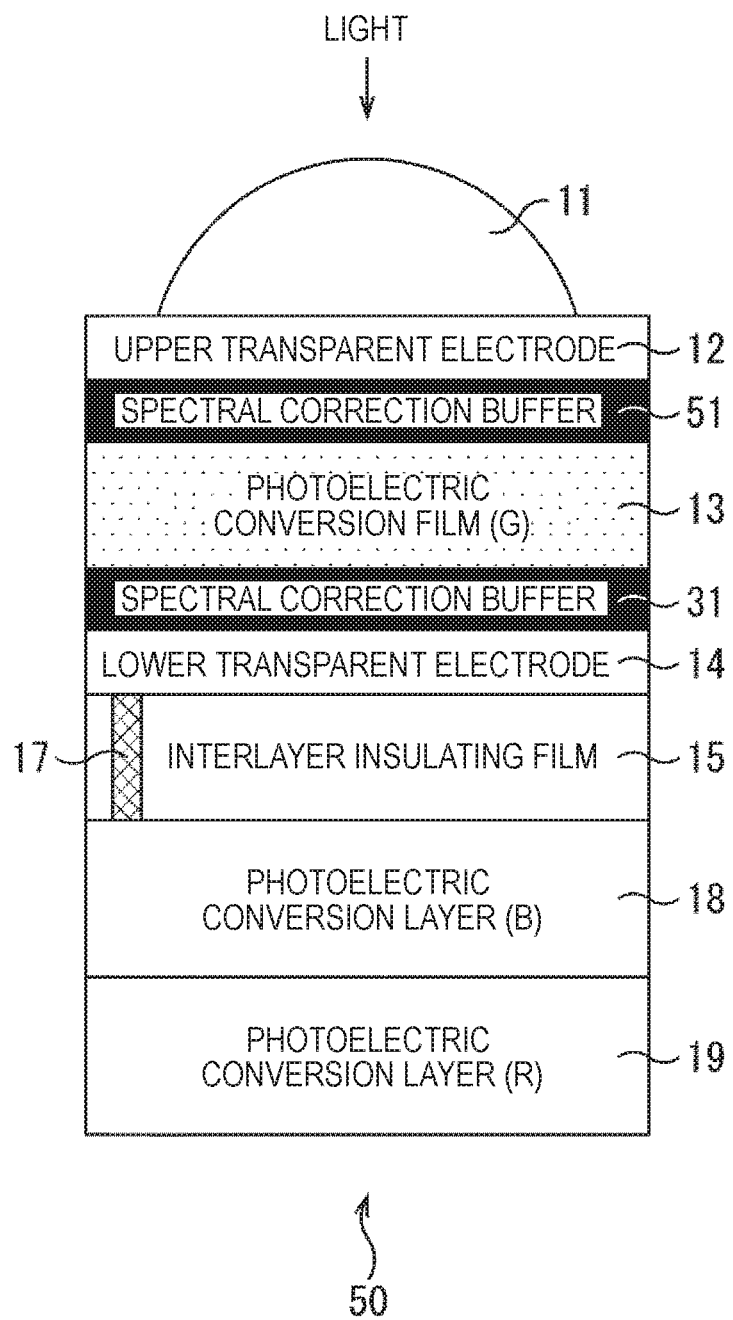
FIG. 7 is a cross-sectional view illustrating a third configuration example of a solid-state image sensor to which the present disclosure is applied.

FIG. 7 is a cross-sectional view illustrating a third configuration example (third embodiment) of a solid-state image sensor to which the present disclosure is applied. Note that components shared by a solid-state image sensor 50, which is the third embodiment, and the solid-state image sensors 10, 30, and 40 described above are denoted by the same reference numerals, and description thereof is omitted as appropriate.

This solid-state image sensor 50 is obtained by replacing the hole blocking layer 41 of the solid-state image sensor 40 illustrated in FIG. 5 with a spectral correction buffer 51.

In the solid-state image sensor 50, a photoelectric conversion module is constituted by the upper transparent electrode 12, the spectral correction buffer 51, the photoelectric conversion film (G) 13, the spectral correction buffer 31, and the lower transparent electrode 14.

The spectral correction buffer 51 can be formed by a material similar to that of the spectral correction buffer 31.

According to the solid-state image sensor 50, the spectral correction buffers 51 and 31 are formed in the photoelectric conversion module; thus, effects similar to those of the solid-state image sensor 40 can be obtained. However, since the spectral correction buffer 51 is provided, the amount of incident light on the lower layer side with respect to the spectral correction buffer 51 decreases to some extent.

Fourth Embodiment

Figure 8:
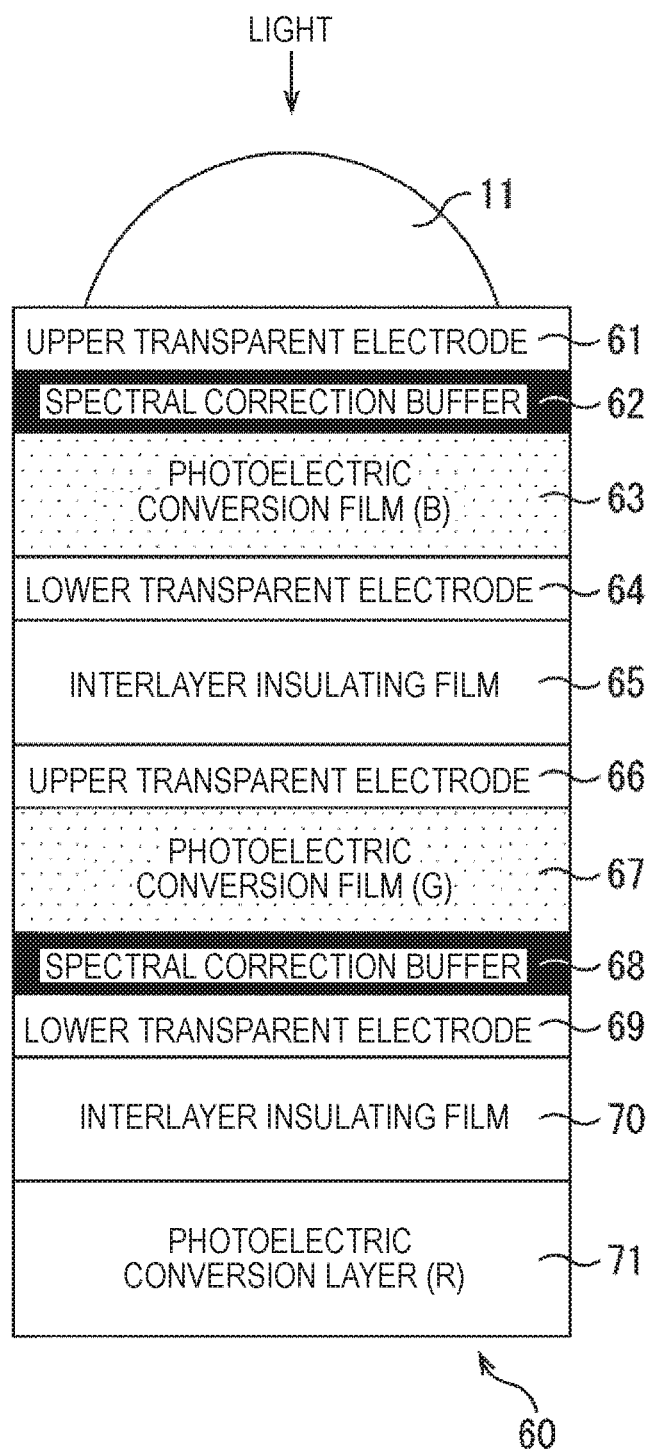
FIG. 8 is a cross-sectional view illustrating a fourth configuration example of a solid-state image sensor to which the present disclosure is applied.

Next, FIG. 8 is a cross-sectional view illustrating a fourth configuration example (fourth embodiment) of a solid-state image sensor to which the present disclosure is applied. Note that components shared by a solid-state image sensor 60, which is the fourth embodiment, and the solid-state image sensors 10, 30, 40, and 50 described above are denoted by the same reference numerals, and description thereof is omitted as appropriate.

This solid-state image sensor 60 includes the on-chip lens 11, an upper transparent electrode 61, a spectral correction buffer 62, a photoelectric conversion film (B) 63 that performs photoelectric conversion on light in a B wavelength range, a lower transparent electrode 64, an interlayer insulating layer 65, an upper transparent electrode 66, a photoelectric conversion film (G) 67 that performs photoelectric conversion on light in a G wavelength range, a spectral correction buffer 68, a lower transparent electrode 69, an interlayer insulating layer 70, and a photoelectric conversion layer (R) 71 that performs photoelectric conversion on light in a R wavelength range, which are stacked in sequence from the light incident surface side.

Note that in each of the photoelectric conversion film (B) 63 and the photoelectric conversion film (G) 67 is formed a through electrode (not illustrated) configured to transfer charge obtained by conversion to a wiring layer.

In the solid-state image sensor 60, a first photoelectric conversion module is constituted by the upper transparent electrode 61, the spectral correction buffer 62, the photoelectric conversion film (B) 63, and the lower transparent electrode 64. In addition, a second photoelectric conversion module is constituted by the upper transparent electrode 66, the photoelectric conversion film (G) 67, the spectral correction buffer 68, and the lower transparent electrode 69.

A material for the upper transparent electrode 61 etc. and the lower transparent electrode 64 etc. is similar to that of the upper transparent electrode 12 and the lower transparent electrode 14 in the solid-state image sensor 30 described above. Similarly, a material for the spectral correction buffer 62 etc. is similar to that of the spectral correction buffer 31 in the solid-state image sensor 30 described above.

Figure 9A:
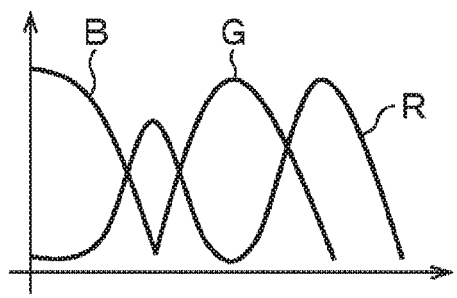
FIGS. 9A, 9B, and 9C illustrate a spectral correction function of spectral correction buffers of FIG. 8.
Figure 9B:
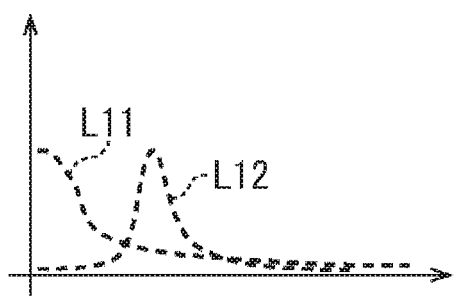
Figure 9C:
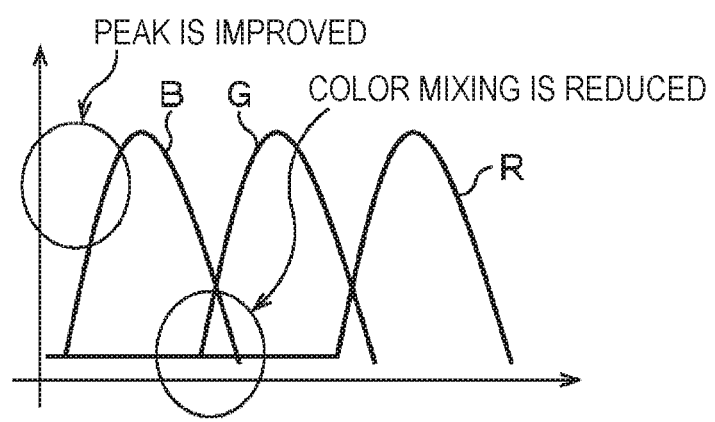

Next, FIGS. 9A, 9B, and 9C illustrate a spectral correction function of the spectral correction buffers 62 and 68 in the solid-state image sensor 60, and the horizontal axis and the vertical axis represent wavelength and intensity, respectively.

In FIG. 9A, a curve B, a curve G, and a curve R indicate, respectively, a wavelength range of light that enters the photoelectric conversion film (B) 63, a wavelength range of light that enters the photoelectric conversion film (G) 67, and a wavelength range of light that enters the photoelectric conversion layer (R) 71, in a state where the spectral correction buffers 62 and 68 are omitted from the solid-state image sensor 60.

A curve L11 in FIG. 9B indicates a wavelength range that the spectral correction buffer 62 absorbs (limits passage of). A curve L12 indicates a wavelength range that the spectral correction buffer 68 absorbs (limits passage of).

In FIG. 9C, a curve B, a curve G, and a curve R indicate, respectively, a wavelength range of light that enters the photoelectric conversion film (B) 63, a wavelength range of light that enters the photoelectric conversion film (G) 67, and a wavelength range of light that enters the photoelectric conversion layer (R) 71, in the solid-state image sensor 60.

For example, in the case where a peak of the wavelength range of light that enters the photoelectric conversion layer (B) 18 spreads on the low wavelength side, as indicated by the curve B in FIG. 9A, the spectral correction buffer 31 that absorbs the low wavelength side of the peak of blue light as indicated by the curve L11 in FIG. 9B is used. In addition, in the case where absorption leakage has occurred at the cross-point of the B wavelength range and the G wavelength range, as indicated by the curve R in FIG. 9A, the spectral correction buffer 68 that absorbs light in a wavelength range where absorption leakage has occurred as indicated by the curve L12 in FIG. 9B is used.

Thus, as illustrated in FIG. 9C, a peak of wavelength of light that enters the photoelectric conversion film (B) 63 can be improved. In addition, color mixing in the photoelectric conversion layer (R) 71 can be reduced.

According to the solid-state image sensor 60, a height reduction can be achieved as compared with the solid-state image sensor 10, and light collection efficiency and oblique light resistance can be improved, as in the solid-state image sensor 30 and the like described above.

Fifth Embodiment

Figure 10:
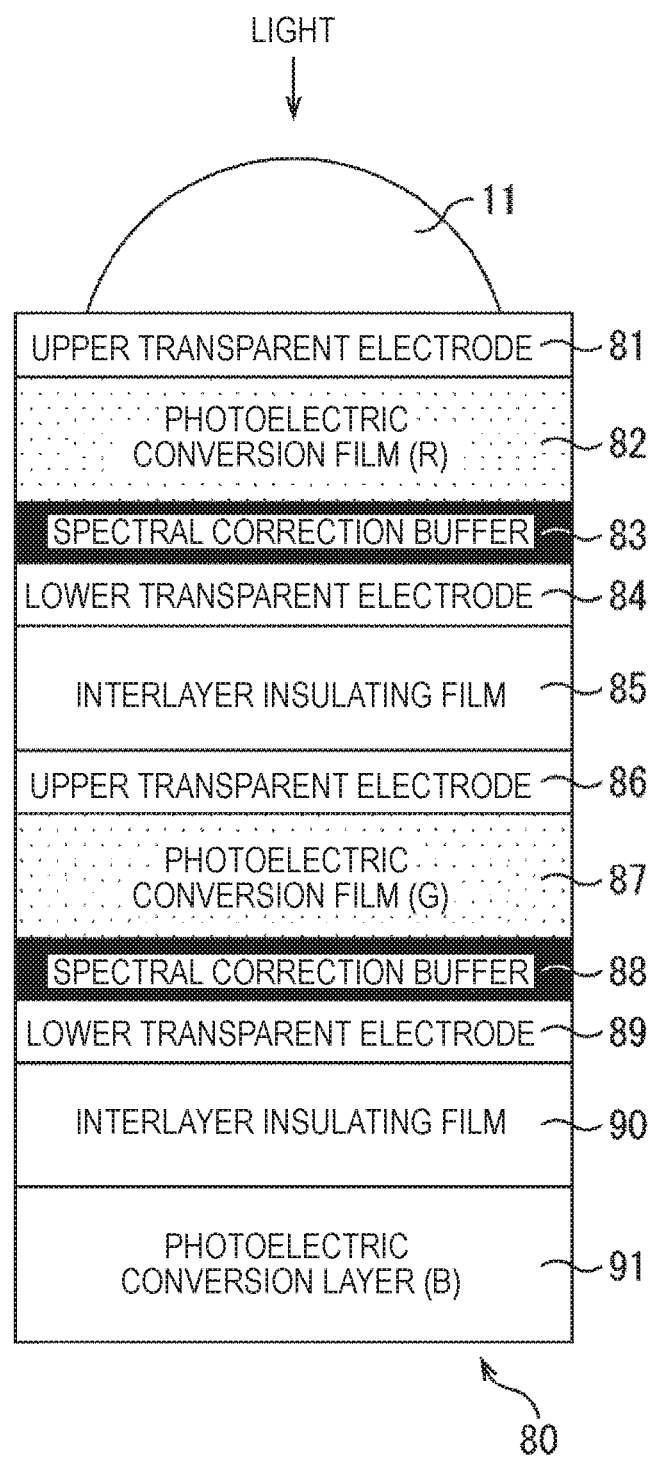
FIG. 10 is a cross-sectional view illustrating a fifth configuration example of a solid-state image sensor to which the present disclosure is applied.

Next, FIG. 10 is a cross-sectional view illustrating a fifth configuration example (fifth embodiment) of a solid-state image sensor to which the present disclosure is applied. Note that components shared by a solid-state image sensor 80, which is the fifth embodiment, and the solid-state image sensors 10, 30, 40, 50, and 60 described above are denoted by the same reference numerals, and description thereof is omitted as appropriate.

This solid-state image sensor 80 includes the on-chip lens 11, an upper transparent electrode 81, a photoelectric conversion film (R) 82 that performs photoelectric conversion on light in a R wavelength range, a spectral correction buffer 83, a lower transparent electrode 84, an interlayer insulating layer 85, an upper transparent electrode 86, a photoelectric conversion film (G) 87 that performs photoelectric conversion on light in a G wavelength range, a spectral correction buffer 88, a lower transparent electrode 89, an interlayer insulating layer 90, and a photoelectric conversion layer (R) 91 that performs photoelectric conversion on light in a B wavelength range, which are stacked in sequence from the light incident surface side.

Note that in each of the photoelectric conversion film (R) 82 and the photoelectric conversion film (G) 87 is formed a through electrode (not illustrated) configured to transfer charge obtained by conversion to a wiring layer.

In the solid-state image sensor 80, a first photoelectric conversion module is constituted by the upper transparent electrode 81, the photoelectric conversion film (R) 82, the spectral correction buffer 83, and the lower transparent electrode 84. In addition, a second photoelectric conversion module is constituted by the upper transparent electrode 86, the photoelectric conversion film (G) 87, the spectral correction buffer 88, and the lower transparent electrode 89.

A material for the upper transparent electrode 81 etc. and the lower transparent electrode 84 etc. is similar to that of the upper transparent electrode 12 and the lower transparent electrode 14 in the solid-state image sensor 30 described above. Similarly, a material for the spectral correction buffer 83 etc. is similar to that of the spectral correction buffer 31 in the solid-state image sensor 30 described above.

Figure 11A:
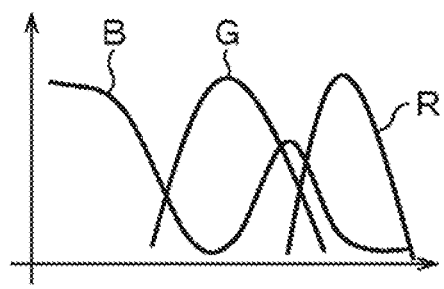
FIGS. 11A, 11B, and 11C illustrate a spectral correction function of spectral correction buffers of FIG. 10.
Figure 11B:
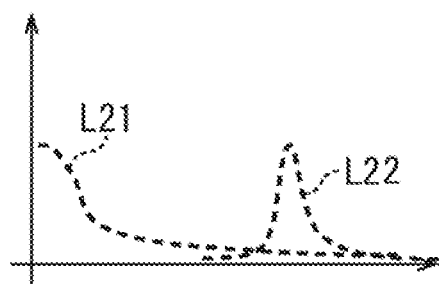
Figure 11C:
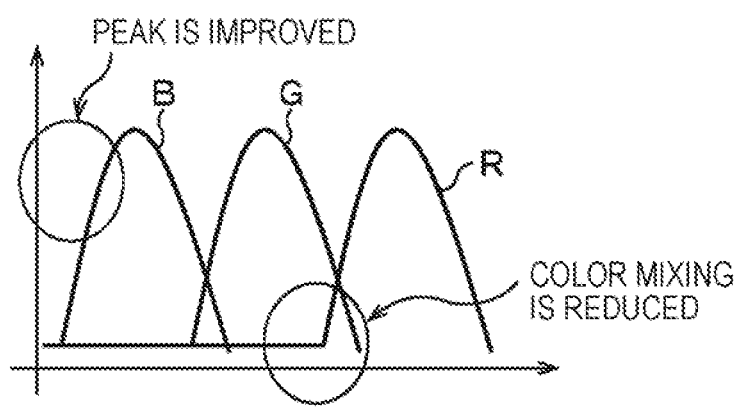

Next, FIGS. 11A, 11B, and 11C illustrate a spectral correction function of the spectral correction buffers 83 and 88 in the solid-state image sensor 80, and the horizontal axis and the vertical axis represent wavelength and intensity, respectively.

In FIG. 11A, a curve B, a curve G, and a curve R indicate, respectively, a wavelength range of light that enters the photoelectric conversion layer (B) 91, a wavelength range of light that enters the photoelectric conversion film (G) 87, and a wavelength range of light that enters the photoelectric conversion film (R) 82, in a state where the spectral correction buffers 83 and 88 are omitted from the solid-state image sensor 80.

A curve L21 in FIG. 11B indicates a wavelength range that the spectral correction buffer 83 absorbs (limits passage of). A curve L22 indicates a wavelength range that the spectral correction buffer 88 absorbs (limits passage of).

In FIG. 11C, a curve B, a curve G, and a curve R indicate, respectively, a wavelength range of light that enters the photoelectric conversion layer (B) 91, a wavelength range of light that enters the photoelectric conversion film (G) 87, and a wavelength range of light that enters the photoelectric conversion film (R) 82, in the solid-state image sensor 80.

For example, in the case where a peak of the wavelength range of light that enters the photoelectric conversion layer (B) 91 spreads on the low wavelength side, and furthermore, absorption leakage has occurred at the cross-point of the G wavelength range and the R wavelength range, as indicated by the curve B in FIG. 11A, the spectral correction buffer 88 that absorbs the low wavelength side of the peak of blue light as indicated by the curve L22 in FIG. 11B and the spectral correction buffer 83 that absorbs light in a wavelength range where absorption leakage has occurred as indicated by the curve L21 are used.

Thus, as illustrated in FIG. 11C, a peak of wavelength of light that enters the photoelectric conversion layer (B) 91 can be improved, and color mixing in the photoelectric conversion layer (B) 91 can be reduced.

According to the solid-state image sensor 80, a height reduction can be achieved as compared with the solid-state image sensor 10, and light collection efficiency and oblique light resistance can be improved, as in the solid-state image sensor 30 and the like described above.

<Usage Example of Solid-State Image Sensor According to Embodiment of Present Disclosure>

Figure 12:
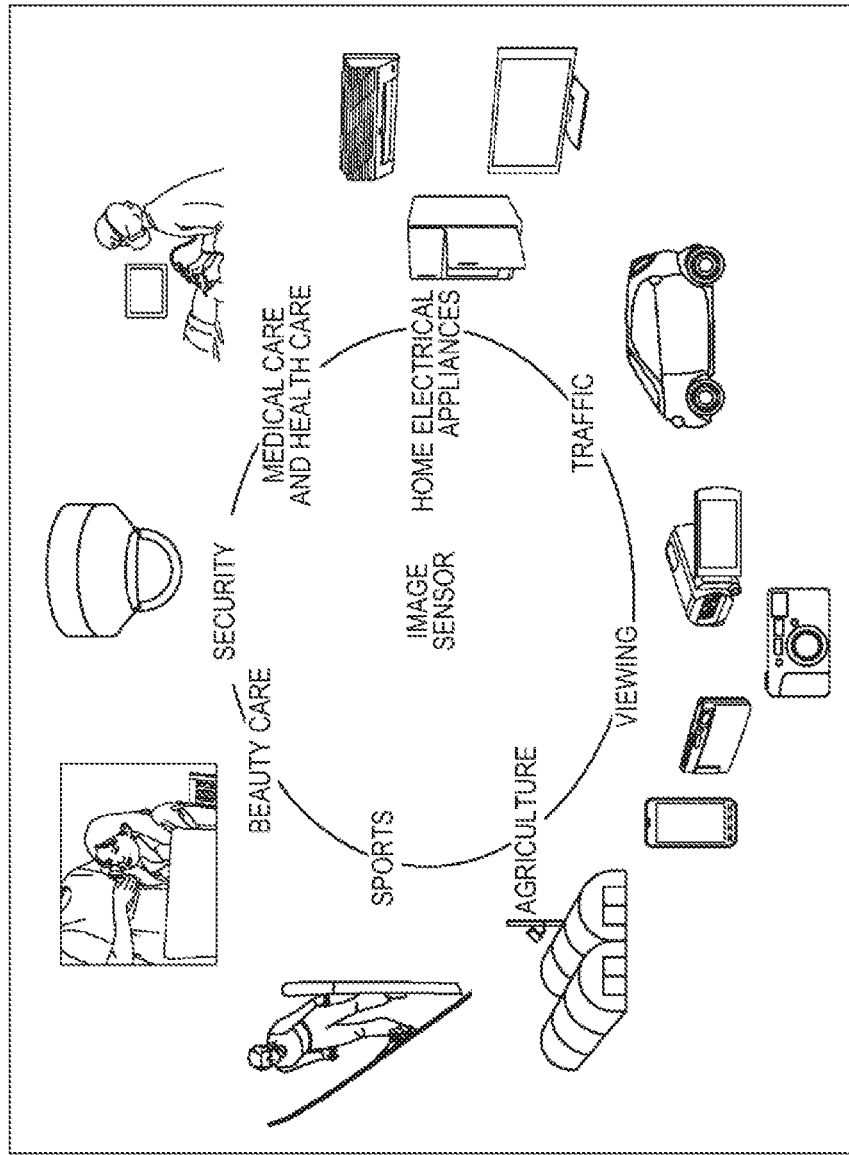

FIG. 12 illustrates a usage example of the above-described solid-state image sensors 30 to 80.

The solid-state image sensors 30 to 80 can be, for example, used in various cases in which light such as visible light, infrared light, ultraviolet light and X-ray is sensed as described below.

Devices that take images used for viewing, such as a digital camera and a portable appliance with a camera function.

Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Devices used for home electrical appliances, such as a TV, a refrigerator, and an air conditioner, to takes images of a gesture of a user and perform appliance operation in accordance with the gesture.

Devices used for medical care and health care, such as an endoscope and a device that performs angiography by reception of infrared light.

Devices used for security, such as a monitoring camera for crime prevention and a camera for personal authentication.

Devices used for beauty care, such as skin measurement equipment that takes images of the skin and a microscope that takes images of the scalp.

Devices used for sports, such as an action camera and a wearable camera for sports and the like.

Devices used for agriculture, such as a camera for monitoring the condition of the field and crops.

An embodiment of the disclosure is not limited to the embodiments described above, and various changes and modifications may be made without departing from the scope of the disclosure.

Additionally, the present technology may also be configured as below.

(1)

A solid-state image sensor of a vertical spectral diffraction type in which a plurality of photoelectric conversion units are stacked in a region of each pixel, the solid-state image sensor including:

a first photoelectric conversion module that includes a first photoelectric conversion unit configured to perform photoelectric conversion on light in a first wavelength range of incident light, a first upper electrode and a first lower electrode formed with the first photoelectric conversion unit placed between the first upper electrode and the first lower electrode, and a first spectral correction unit formed between the first upper electrode and the first lower electrode to be stacked on the first photoelectric conversion unit; and a second photoelectric conversion unit configured to perform photoelectric conversion on light in a second wavelength range of light that has passed through the first photoelectric conversion module, the second wavelength range being different from the first wavelength range.

(2)

The solid-state image sensor according to (1), further including a third photoelectric conversion unit configured to perform photoelectric conversion on light in a third wavelength range of light that has passed through the first photoelectric conversion module and the second photoelectric conversion unit, the third wavelength range being different from the first and second wavelength ranges.

(3)

The solid-state image sensor according to (1) or (2), in which the first spectral correction unit has at least one of a function of extracting a carrier from the first photoelectric conversion unit and a function of blocking electron injection to the first photoelectric conversion unit.

(4)

The solid-state image sensor according to any one of (1) to (3), in which the first spectral correction unit is made of a quantum dot material, a low-molecular organic material, or a high-molecular organic material having a light absorption peak in a specific wavelength range.

(5)

The solid-state image sensor according to any one of (1) to (4), in which in the first photoelectric conversion module, the first upper electrode, the first photoelectric conversion unit, the first spectral correction unit, and the first lower electrode are stacked in sequence from a light incident side.

(6)

The solid-state image sensor according to any one of (1) to (5), in which the first photoelectric conversion module further includes a hole blocking unit, and the first upper electrode, the hole blocking unit, the first photoelectric conversion unit, the first spectral correction unit, and the first lower electrode are stacked in sequence from a light incident side.

(7)

The solid-state image sensor according to any one of (1) to (5), in which the first photoelectric conversion module further includes a second spectral correction unit, and the first upper electrode, the second spectral correction unit, the first photoelectric conversion unit, the first spectral correction unit, and the first lower electrode are stacked in sequence from a light incident side.

(8)

The solid-state image sensor according to any one of (1) and (3) to (7), further including a second photoelectric conversion module that includes a third photoelectric conversion unit configured to perform photoelectric conversion on light in a third wavelength range of light that has passed through the first photoelectric conversion module, the third wavelength range being different from the first wavelength range, a second upper electrode and a second lower electrode formed with the third photoelectric conversion unit placed between the second upper electrode and the second lower electrode, and a third spectral correction unit formed between the second upper electrode and the second lower electrode to be stacked on the third photoelectric conversion unit, in which the second photoelectric conversion unit performs photoelectric conversion on light in the second wavelength range of light that has passed through the first and second photoelectric conversion modules.

(9)

An electronic apparatus equipped with a solid-state image sensor of a vertical spectral diffraction type in which a plurality of photoelectric conversion units are stacked in a region of each pixel, in which the solid-state image sensor includes a first photoelectric conversion module that includes a first photoelectric conversion unit configured to perform photoelectric conversion on light in a first wavelength range of incident light, a first upper electrode and a first lower electrode formed with the first photoelectric conversion unit placed between the first upper electrode and the first lower electrode, and a first spectral correction unit formed between the first upper electrode and the first lower electrode to be stacked on the first photoelectric conversion unit, and a second photoelectric conversion unit configured to perform photoelectric conversion on light in a second wavelength range of light that has passed through the first photoelectric conversion module, the second wavelength range being different from the first wavelength range.

REFERENCE SIGNS LIST

11 chip-on lens
12 upper transparent electrode
13 photoelectric conversion film (G)
14 lower transparent electrode
15 interlayer insulating film
17 through electrode
18 photoelectric conversion layer (B)
19 photoelectric conversion layer (R)
30 solid-state image sensor
31 spectral correction buffer
40 solid-state image sensor
41 hole blocking layer
50 solid-state image sensor
51 spectral correction buffer
60 solid-state image sensor
80 solid-state image sensor

The invention claimed is:
1. A solid-state image sensor, comprising:
a first photoelectric conversion module that includes:
a first upper electrode;
a first lower electrode;
a first photoelectric conversion unit between the first upper electrode and the first lower electrode, wherein the first photoelectric conversion unit is configured to execute photoelectric conversion on light in a first wavelength range of incident light incident on the solid-state image sensor; and
a first spectral correction unit between the first photoelectric conversion unit and the first lower electrode, wherein
the first spectral correction unit is configured to at least one of:
extract a carrier from the first photoelectric conversion unit, or block electron injection from the first lower electrode to the first photoelectric conversion unit,
the first spectral correction unit has a light absorption peak in a specific wavelength range, and
the first spectral correction unit includes one of a quantum dot material or an organic material; and
a second photoelectric conversion unit configured to execute photoelectric conversion on light in a second wavelength range of the incident light, wherein
the second wavelength range is different from the first wavelength range.

2. The solid-state image sensor according to claim 1, further comprising a second photoelectric conversion module that includes:
a second upper electrode;
a second lower electrode;
a third photoelectric conversion unit between the second upper electrode and the second lower electrode, wherein
the third photoelectric conversion unit is configured to execute photoelectric conversion on light in a third wavelength range of the incident light,
the photoelectric conversion is executed on the light in the third wavelength range that has passed through the first photoelectric conversion module, and
the third wavelength range is different from the first wavelength range; and
a second spectral correction unit between the second upper electrode and the second lower electrode, wherein
the second spectral correction unit is on the third photoelectric conversion unit, and
the second photoelectric conversion unit is further configured to execute the photoelectric conversion on the light in the second wavelength range of the incident light that has passed through the first photoelectric conversion module and the second photoelectric conversion module.

3. The solid-state image sensor according to claim 1, further comprising a third photoelectric conversion unit configured to execute photoelectric conversion on light in a third wavelength range of the incident light, wherein
the photoelectric conversion is executed on the light in the third wavelength range that has passed through the first photoelectric conversion module and the second photoelectric conversion unit, and
the third wavelength range is different from the first wavelength range and the second wavelength range.

4. The solid-state image sensor according to claim 3, wherein the first upper electrode, the first photoelectric conversion unit, the first spectral correction unit, and the first lower electrode are in sequence in the first photoelectric conversion module from a light incident side of the solid-state image sensor.

5. The solid-state image sensor according to claim 3, wherein
the first photoelectric conversion module further includes a hole blocking unit, and
the first upper electrode, the hole blocking unit, the first photoelectric conversion unit, the first spectral correction unit, and the first lower electrode are in sequence in the first photoelectric conversion module from a light incident side of the solid-state image sensor.

6. The solid-state image sensor according to claim 3, wherein
the first photoelectric conversion module further includes a second spectral correction unit, and
the first upper electrode, the second spectral correction unit, the first photoelectric conversion unit, the first spectral correction unit, and the first lower electrode are in sequence in the first photoelectric conversion module from a light incident side of the solid-state image sensor.

7. An electronic apparatus, comprising:
a solid-state image sensor that includes:
a photoelectric conversion module that includes:
an upper electrode;
a lower electrode;
a first photoelectric conversion unit between the upper electrode and the lower electrode, wherein
the first photoelectric conversion unit is configured to execute photoelectric conversion on light in a first wavelength range of incident light incident on the solid-state image sensor; and
a spectral correction unit between the first photoelectric conversion unit and the lower electrode, wherein
the spectral correction unit is configured to at least one of:
extract a carrier from the first photoelectric conversion unit, or
block electron injection from the lower electrode to the first photoelectric conversion unit,
the spectral correction unit has a light absorption peak in a specific wavelength range, and
the spectral correction unit includes one of a quantum dot material or an organic material; and
a second photoelectric conversion unit configured to execute photoelectric conversion on light in a second wavelength range of the incident light, wherein
the second wavelength range is different from the first wavelength range.

* * * * *